US007985297B2

(12) United States Patent
Park et al.

(10) Patent No.: US 7,985,297 B2
(45) Date of Patent: Jul. 26, 2011

(54) METHOD OF CLEANING A QUARTZ PART

(75) Inventors: Jung-Dae Park, Ansan-si (KR); Pil-Kwon Jun, Seoul (KR); Bo-Yong Lee, Osan-si (KR); Tae-Hyo Choi, Yongin-si (KR); Da-Hee Lee, Pyeongtaek-si (KR); Seung-Ki Chae, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 81 days.

(21) Appl. No.: 12/500,141

(22) Filed: Jul. 9, 2009

(65) Prior Publication Data

US 2010/0009883 A1 Jan. 14, 2010

(30) Foreign Application Priority Data

Jul. 14, 2008 (KR) ................................ 2008-68104

(51) Int. Cl.
*H01L 21/02* (2006.01)

(52) U.S. Cl. ................................ 134/3; 134/2; 510/175

(58) Field of Classification Search .................. 134/2, 3; 510/175

See application file for complete search history.

(56) References Cited

U.S. PATENT DOCUMENTS

| | | | | |
|---|---|---|---|---|
| 5,259,888 | A * | 11/1993 | McCoy | 134/2 |
| 5,409,569 | A * | 4/1995 | Seki et al. | 216/99 |
| 5,560,857 | A * | 10/1996 | Sakon et al. | 510/175 |
| 6,284,721 | B1 * | 9/2001 | Lee | 510/175 |
| 6,431,186 | B1 * | 8/2002 | Morita et al. | 134/1.3 |
| 7,135,445 | B2 | 11/2006 | Charm et al. | |
| 7,250,114 | B2 * | 7/2007 | Kiehlbauch et al. | 216/31 |
| 2002/0037654 | A1 * | 3/2002 | Hayashi et al. | 438/745 |
| 2002/0078710 | A1 * | 6/2002 | Takeuchi et al. | 65/31 |
| 2005/0274396 | A1 | 12/2005 | Shih et al. | |
| 2007/0203041 | A1 * | 8/2007 | Lee | 510/175 |

FOREIGN PATENT DOCUMENTS

| | | | |
|---|---|---|---|
| JP | 2008153271 | A * | 7/2008 |
| KR | 1020060102244 | | 9/2006 |

* cited by examiner

*Primary Examiner* — Gregory E Webb
(74) *Attorney, Agent, or Firm* — F. Chau & Associates, LLC

(57) ABSTRACT

A cleaning solution for a quartz part and a method for cleaning the quartz part are provided. The cleaning solution includes from about 5 to about 35 wt % of an ammonium compound, from about 7 to about 55 wt % of an acidic oxidizing agent, from about 5 to about 30 wt % of a fluorine compound and a remaining amount of water. Residual thin films and impurities on the surface of the quartz part may be removed while reducing the damage onto the quartz part.

19 Claims, 4 Drawing Sheets

450(TIMES)

2000(TIMES)

450(TIMES)

2000(TIMES)

450(TIMES)

2000(TIMES)

METHOD OF CLEANING A QUARTZ PART

CROSS-REFERENCE TO RELATED APPLICATION

This application claims priority under 35 U.S.C. §119 to Korean patent Application No. 2008-68104, filed on Jul. 14, 2008, the disclosure of which is hereby incorporated by reference herein in it's entirety.

BACKGROUND

1. Technical Field

Example embodiments of the present invention relate to a cleaning solution for a quartz part and to a method of cleaning the quartz part using the same. More particularly, example embodiments of the present invention relate to a cleaning solution for a quartz part to remove residual thin films and particles remaining on the surface of the quartz part of an apparatus for manufacturing a semiconductor device and to a method of cleaning the quartz part using the cleaning solution.

2. Description of the Related Art

Generally, a semiconductor device is formed by performing unit processes including a thin layer forming process, a photoresist pattern forming process, an etching process, a cleaning process, and so on. The thin layer may include a silicon oxide layer, a silicon nitride layer, a metal oxide layer, a metal nitride layer or a metal layer. The thin layer may be formed by depositing corresponding material on a semiconductor substrate. The photoresist pattern may be formed by implementing the processes of forming a photoresist layer on a substrate, exposing the formed photoresist layer and then developing the exposed layer. The etching process may be performed to selectively remove the thin layer using the photoresist pattern as an etching mask and the cleaning process may then be implemented to remove residual photoresist patterns and impurities on the substrate after completing the etching process.

For performing the unit processes for manufacturing the semiconductor device, chambers or tubes of process facilities for applying the following processes of, for example, a chemical vapor deposition (CVD) process, a metal deposition process, a diffusion process, etc. may be utilized when forming thin layers. The chambers or tubes may mostly include parts made by, for example, using salt-resistant and chemical-resistant quartz.

In particular, even though the quartz parts may not directly contact wafers, the quartz parts may still be exposed to gases employed during implementing the depositing process along with the wafers. As a result, the surface of the quartz parts may suffer from minute damage and impurity-containing thin films may be formed on the surface of the quartz parts. Consequently, the impurity-containing thin films may be transferred to the wafer to induce a defect, so the manufacturing process of the semiconductor device is periodically halted and the quartz parts are separated from the apparatus to implement a cleaning process.

Nowadays, the cleaning of the quartz parts is performed using a cleaning solution obtained by mixing hydrofluoric acid (HF) and nitric acid ($HNO_3$) in a predetermined mixing ratio and by using a cleaning apparatus of a bath type or a spray type for at least about 30 minutes. According to the above-described cleaning method, the thin films and the particles deposited onto the quartz parts can be readily removed, but the surface portion of the quartz parts may be excessively etched.

The excessive etching may induce the contamination of the wafer and further, when the cleaning process of the quartz parts is performed several times, the weight and the surface profile of the quartz parts may be changed.

FIG. 1 is a photograph for showing the surface portion of a piece of a quartz part after implementing a cleaning process using the conventional cleaning solution for the quartz parts.

Referring to the photograph illustrated in FIG. 1, the weight change of the quartz part is large and the surface profile of the quartz part is seriously changed. Therefore, the installation of the quartz part to the manufacturing facilities of the semiconductor devices may become very difficult.

SUMMARY

Example embodiments of the present invention may provide a cleaning solution for a quartz part employed in an apparatus for manufacturing a semiconductor device without resulting in an excessive damage of the quartz part while effectively removing remaining thin films and/or impurities from the surface of the quartz part.

Example embodiments of the present invention may also provide a method of cleaning a quartz part by which residual thin films and impurities on the quartz parts of the manufacturing apparatus of the semiconductor devices can be effectively removed using the cleaning solution.

In accordance with an example embodiment of the present invention, a cleaning solution for a quartz part is provided. The cleaning solution includes from about 5 to about 35 wt % of an ammonium compound, from about 7 to about 55 wt % of an acidic oxidizing agent, from about 5 to about 30 wt % of a fluorine compound and a remaining amount of water. The thin films and the particles remaining on the quartz part may be removed by using the cleaning solution.

In an example embodiment, the ammonium compound may be at least one selected from the group consisting of ammonium hydroxide, methyl ammonium hydroxide, ethyl ammonium hydroxide, ammonium chloride ($NH_4Cl$), ammonium bromide ($NH_4Br$) and ammonium carbonate ($(NH_4)_2CO_3$).

In an example embodiment, the fluorine compound may be at least one selected from the group consisting of hydrofluoric acid, ammonium fluoride, tetramethyl ammonium fluoride, tetraethyl ammonium fluoride, tetrapropyl ammonium fluoride and tetrabutyl ammonium fluoride. And the oxidizing agent may be at least one selected from the group consisting of sulfuric acid, nitric acid, ammonium nitrate, ammonium sulfate, ammonium phosphate and hydrogen peroxide solution.

In accordance with an example embodiment of the present invention, a cleaning solution for a quartz part for removing a thin film and impurities on a surface of the quartz part employed in an apparatus for manufacturing a semiconductor device is provided. The cleaning solution includes from about 5 to about 35 wt % of an ammonium compound, from about 7 to about 55 wt % of an acidic oxidizing agent, from about 5 to about 30 wt % of a fluorine compound, from about 0.1 to about 2 wt % of an organic acid and a remaining amount of water. The thin films and the particles remaining on the surface portion of a quartz part of an apparatus for manufacturing a semiconductor device may be removed while reducing or suppressing the damage onto the quartz part during cleaning the quartz part using the cleaning solution.

In an example embodiment, the cleaning solution may include from about 10 to about 1000 ppm of a nonionic surfactant and the thin film may include at least one impurity selected from the group consisting of an oxygen-containing impurity, a carbon-containing impurity and a metal-containing impurity.

In accordance with an example embodiment of the present invention, a method for cleaning a quartz part of an apparatus for manufacturing a semiconductor device is provided. The method includes providing a cleaning solution to a quartz part including a residual thin film and impurities. The cleaning solution includes from about 5 to about 35 wt % of an ammonium compound, from about 7 to about 55 wt % of an acidic oxidizing agent, from about 5 to about 30 wt % of a fluorine compound and a remaining amount of water. The method further includes implementing a cleaning process for removing the residual thin film and the impurities on a surface of the quartz part using the cleaning solution.

In accordance with another example embodiment of the present invention, a method of cleaning a quartz part is provided. The method includes providing a cleaning solution to the quartz part including a residual thin film and impurities. The cleaning solution includes from about 5 to about 35 wt % of an ammonium compound, from about 7 to about 55 wt % of an acidic oxidizing agent, from about 5 to about 30 wt % of a fluorine compound, from about 0.1 to about 2 wt % of an organic acid and a remaining amount of water. The method further includes implementing a cleaning process for removing the residual thin film and the impurities on a surface of the quartz part using the cleaning solution.

According to example embodiments, the cleaning solution includes an ammonium compound, an acidic oxidizing agent, a fluorine compound and water, and may effectively remove the thin films, the impurities and particles from the surface of the quartz parts applied for the apparatus for manufacturing a semiconductor device. In addition, the residual thin films and particles on the surface of the quartz parts of the apparatus for manufacturing the semiconductor device can be rapidly removed without resulting in an excessive damage onto the quartz parts of the apparatus for manufacturing the semiconductor device.

BRIEF DESCRIPTION OF THE DRAWINGS

Example embodiments can be more clearly understood from the following detailed description taken in conjunction with the accompanying drawings. FIGS. 1 to 5 represent non-limiting example embodiments as described herein.

FIG. 1 is a photograph for showing the surface portion of a piece of a quartz part after implementing a cleaning process using the conventional cleaning solution for the quartz part;

FIG. 2 is a process flow chart illustrating a cleaning method of a quartz part for removing residual impurities on the quartz part in accordance with an example embodiment;

DETAILED DESCRIPTION OF EXAMPLE EMBODIMENTS

Figure 1:
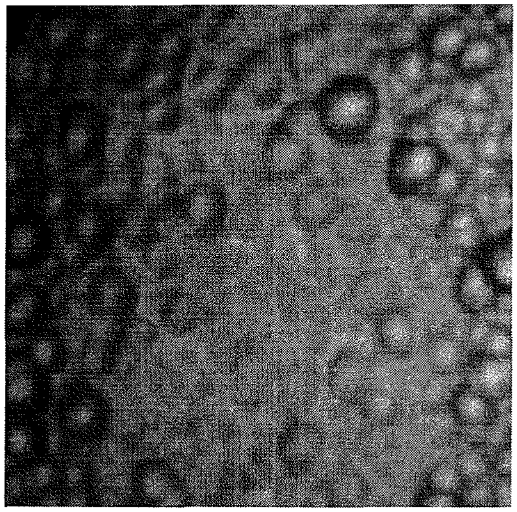
FIG. 1 (RELATED ART)

Various example embodiments will be described more fully hereinafter with reference to the accompanying drawings, in which some example embodiments are shown. Example embodiments may, however, be embodied in many different forms and should not be construed as limited to the example embodiments set forth herein. In the drawings, the sizes and relative sizes of layers and regions may be exaggerated for clarity.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments relating to a cleaning solution of quartz parts and a method of cleaning the quartz parts using the cleaning solution will be fully described hereinafter.

Cleaning Solution for Quartz Parts

Embodiment 1

The cleaning solution for quartz parts in accordance with example embodiments may be applied to remove residual thin films and particles on the quartz parts of an apparatus for manufacturing a semiconductor device or a semiconductor manufacturing equipment, and includes an ammonium compound, an acidic oxidizing agent, a fluorine compound and water. For example, the cleaning solution of the quartz parts in accordance with the example embodiments includes from about 5 to about 35 wt % of an ammonium compound, from about 7 to about 55 wt % of an acidic oxidizing agent, from about 5 to about 30 wt % of a fluorine compound and the remaining amount of water.

The quartz parts may be installed in various apparatuses including, for example, a dry etching apparatus, a thin film deposition apparatus and a diffusion apparatus utilized for the manufacture of the semiconductor devices. The quartz parts may be, for example, a quartz nozzle, a quartz tube, a distributing plate, an inner wall of a chamber, and so on. The residual thin films and the particles on the quartz parts are residual materials deposited on the quartz parts after implementing some processes such as, for example, a deposition process, an etching process, etc. The residual thin films and the particles may include, for example, a carbon-containing impurity, a metal-containing impurity, an oxygen-containing impurity, etc. and are strongly attached onto the quartz parts.

The ammonium compound constituting the cleaning solution of the quartz parts may improve the solubility of the thin films and the particles including, for example, adsorbed silicon fluoride ($SiF_6^{2-}$) or a metal onto the quartz parts after being separated from the semiconductor substrate during implementing the etching process, thereby improving the removing efficiency of the thin films and the particles.

Examples of the ammonium compound may include but are not limited to ammonium hydroxide, methyl ammonium hydroxide, ethyl ammonium hydroxide, ammonium chloride ($NH_4Cl$), ammonium bromide ($NH_4Br$), ammonium carbonate ($(NH_4)_2CO_3$) and so on. The exemplified compounds can be used alone or as a mixture of them.

In example embodiments, the amount of the ammonium compound contained in the cleaning solution for the quartz parts may be, for example, from about 5 wt % to about 35 wt %. When the amount of the ammonium compound is less than about 5 wt %, the thin films including silicon fluoride or the metal may not be readily removed. When the amount of the ammonium compound exceeds about 35 wt %, the quartz parts may be excessively etched. In other example embodiments, the amount of the ammonium compound may be, for example, in the range of from about 10 wt % to about 20 wt %.

The oxidizing agent included in the cleaning solution for the quartz parts may oxidize insoluble thin films and impurities to convert them into soluble materials. For example, the thin films and impurities may include silicon (Si), silicon nitride (SiN) and/or a metal (e.g., titanium (Ti), tantalum (Ta), aluminum (Al), tungsten (W), etc.), and the oxidizing agent may oxidize the thin films and impurities to produce silicon oxide ($SiO_2$) or metal oxide ($MO_x$). That is, the acidic oxidizing agent may function as an oxygen supplying source to change the undesirable materials to oxidized materials which are liable to dissolve in the cleaning solution including a fluorine compound. Examples of the acidic oxidizing agent may include but are not limited to sulfuric acid, hydrofluoric acid, nitric acid, ammonium nitrate, ammonium sulfate, hydrogen peroxide solution, ammonium phosphate, etc. These compounds may be used alone or as a mixture of them.

In some example embodiments, the amount of the acidic oxidizing agent included in the cleaning solution for the quartz parts may be in the range of, for example, from about 7 to about 55 wt %. When the amount of the oxidizing agent is less than about 7 wt %, the generating rate of oxygen within the cleaning solution may be too low to oxidize the residual silicon or metal on the quartz parts. When the amount of the acidic oxidizing agent exceeds about 55 wt %, the acidity of the cleaning solution may increase to cause damage to the quartz parts. In other example embodiments, the amount of the oxidizing agent may be, for example, from about 15 to about 35 wt %.

Among the components included in the cleaning solution of the quartz parts, the fluorine compound may function to etch and remove the metal oxide or the silicon oxide. The fluorine compound may provide fluoride ions necessary for etching the metal oxide or the silicon oxide.

Examples of the fluorine compound may include but are not limited to hydrofluoric acid, ammonium fluoride, tetramethyl ammonium fluoride, tetraethyl ammonium fluoride, tetrapropyl ammonium fluoride, tetrabutyl ammonium fluoride, and the like. The exemplified compounds may be used alone or as a mixture of them. Among the fluorine compounds, the compounds including ammonium fluoride may have a relatively low etching rate and a low corrosiveness with respect to quartz and thus the fluorine compounds including ammonium fluoride may chemically and effectively remove the thin films attached to the quartz parts without damaging the surface portion of the quartz parts. At this time, the ammonium fluoride may be added into the cleaning solution taking into account, for example, the solubility in the cleaning solution and the surface corrosiveness of the quartz parts.

In example embodiments, the amount of the fluorine compound in the cleaning solution for the quartz parts may be in the range of, for example, from about 5 to about 30 wt %. When the amount of the fluorine compound is less than about 5 wt %, the generating rate of the fluoride ions within the cleaning solution may be too low to remove oxide-based impurities or the oxidative thin film from the quartz parts. When the amount of the fluorine compound exceeds about 30 wt %, a difficulty such as the damaging of the quartz parts may occur. In other example embodiments, the amount of the fluorine compound may be, for example, in the range of from about 10 to about 20 wt %.

The cleaning solution for the quartz parts having the above-described constitution may prevent the surface damage of the quartz parts employed in the apparatus for manufacturing the semiconductor memory device, and may effectively remove the remaining thin films or impurities from the surface portion of the quartz parts within a relatively short time. Therefore, the deformation of the quartz parts due to the surface damage during the implementing of a cleaning process utilizing the cleaning solution may be prevented and the lifetime of the apparatus for manufacturing the semiconductor device may be prolonged.

Embodiment 2

The cleaning solution for the quartz parts in accordance with example embodiments may be used for removing thin films and particles remaining on the surface portion of the quartz parts employed in an apparatus for manufacturing semiconductor devices or a semiconductor manufacturing equipment. The cleaning solution may include, for example, an ammonium compound, an acidic oxidizing agent, a fluorine compound, an organic acid for improving the etching rate of metal oxide and water.

The cleaning solution may include, for example, from about 5 to about 35 wt % of an ammonium compound, from about 7 to about 55 wt % of an acidic oxidizing agent, from about 5 to about 30 wt % of a fluorine compound, from about 0.1 to about 2 wt % of an organic acid for improving the etching rate of the metal oxide and the remaining amount of water. According to another example embodiment, the cleaning solution for the quartz parts may include, for example, from about 5 to about 35 wt % of an ammonium compound, from about 7 to about 55 wt % of an acidic oxidizing agent, from about 5 to about 30 wt % of a fluorine compound, from about 0.1 to about 2 wt % of an organic acid for improving the etching rate of the metal oxide, from about 10 to about 1000 ppm of a nonionic surfactant and the remaining amount of water.

The ammonium compound, the acidic oxidizing agent, the fluorine compound and amounts thereof have been previously described in Embodiment 1, so any further explanation in this regard will be omitted. The functions and the amounts of the organic acid and the nonionic surfactant will be described in detail, hereinafter.

The organic acid included in the cleaning solution for the quartz parts may be an additive for etching to improve the etching rate of the metal oxide. Examples of the organic acid may include but are not limited to acetic acid, oxalic acid, malonic acid, succinic acid and ethylenediaminetetraacetic acid (EDTA). These compounds may be used alone or as a mixture of them.

In example embodiments, the amount of the organic acid included in the cleaning solution may be in the range of, for example, from about 0.1 to about 2 wt %. When the amount of the organic acid is less than about 0.1 wt %, the improvement of the etching rate of the cleaning solution for the quartz parts with respect to the metal oxide may not be expected. When the amount of the organic acid exceeds about 2 wt %, the acidity of the cleaning solution may increase and the surface portion of the quartz parts may be damaged. In other example embodiments, the amount of the organic acid may be in the range of, for example, from about 0.5 to about 1.5 wt %.

The nonionic surfactant contained in the cleaning solution may form a bond (e.g., a dangling bond) with the exposed surface of the quartz parts after removing the thin films and the impurities. The nonionic surfactant may be adsorbed onto the surface of the quartz parts to improve etching uniformity. Therefore, the surface portion of the quartz parts may become uniform after implementing the cleaning process.

The nonionic surfactant applicable in example embodiments may include, for example, a polymer of ethylene oxide and/or propylene oxide. In particular, examples of the nonionic surfactant applicable in the cleaning solution may include but are not limited to NCW-1002 (trade name of WAKO Chemical Ltd., Japan), a block copolymer of polyethyleneglycol and polypropyleneglycol, and so on. Examples of the block copolymer of polyethyleneglycol and polypropyleneglycol may include but are not limited to Synperonic PE/F68, Synperonic PE/L61, Synperonic PE/L64 (trade names of FLUKA Chemika, Germany), etc.

Here, the amount of the nonionic surfactant included in the cleaning solution may be in the range of, for example, from about 10 to about 1000 ppm. When the amount of the nonionic surfactant is less than about 10 ppm, the adsorbed amount of the nonionic surfactant onto the surface of the quartz parts, which is exposed after removing the thin films and the impurities, may be insufficient and the quartz parts having a uniform surface may not be obtainable. When the amount of the nonionic surfactant exceeds about 1000 ppm, the nonionic surfactant may combine to the thin films and the removal of the thin films may become difficult. In other example embodiments, the amount of the nonionic surfactant may be in the range of, for example, from about 100 to about 600 ppm.

The cleaning solution for the quartz parts including the above-described components in accordance with Embodiment 2 may have more powerful cleaning efficiency of removing the thin films and the impurities. Further, the non-uniform etching of the surface of the quartz parts may be restrained when applying the cleaning solution disclosed in this Embodiment 2.

Method of Removing Thin Films and Impurities from Quartz Parts

The method of removing the thin films and the impurities in accordance with the example embodiments may be performed by cleaning the quartz parts installed in the apparatus for manufacturing a semiconductor device using the cleaning solution including the components disclosed in Embodiments 1 and 2.

Figure 2:
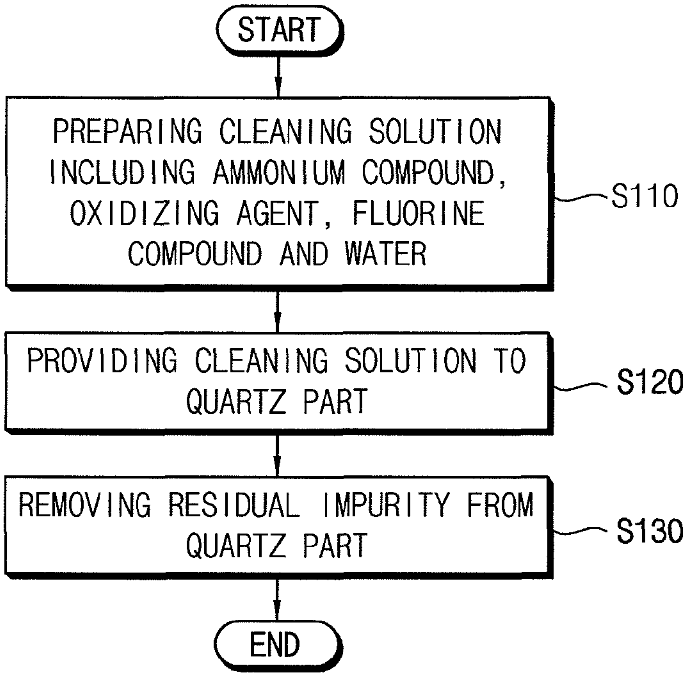

FIG. 2 is a process flow chart illustrating a cleaning method for removing residual thin films and impurities on the quartz parts in accordance with example embodiments.

Referring to FIG. 2, a cleaning solution including, for example, an ammonium compound, an acidic oxidizing agent, a fluorine compound and water is prepared to carry out a method of cleaning to remove the thin films and the impurities remaining on the quartz parts (S110).

As an example embodiment, a cleaning solution was prepared for the quartz parts according to the description in Embodiment 1 and including, for example, about 5 to 35 wt % of an ammonium compound, about 7 to 55 wt % of an acidic oxidizing agent, about 5 to 30 wt % of a fluorine compound and the remaining amount of water. Here, the description on the cleaning solution for the quartz parts has been provided in detail in Embodiment 1, so any further explanations in this regard will be omitted.

As another example, the cleaning solution for the quartz parts according to the description in Embodiment 2 may be prepared which includes, for example, about 5 to 35 wt % of an ammonium compound, about 7 to 55 wt % of an acidic oxidizing agent, about 5 to 30 wt % of a fluoride compound, about 0.1 to 2 wt % of an organic acid for improving the etching rate of metal oxide and the remaining amount of water. The cleaning solution also may include, for example, about 5 to 35 wt % of an ammonium compound, about 7 to 55 wt % of an acidic oxidizing agent, about 5 to 30 wt % of a fluoride compound, about 0.1 to 2 wt % of an organic acid for improving the etching rate of metal oxide, about 10 to 1000 ppm of a nonionic surfactant and the remaining amount of water. Because the description on the cleaning solution for the quartz parts has been illustrated in detail in Embodiment 2, it will be omitted.

After that, the cleaning solution for the quartz parts is provided to the quartz parts of the apparatus for manufacturing the semiconductor device (S120).

According to an example embodiment, the cleaning solution for the quartz parts may be sprayed onto the surface portion of the quartz parts including the thin films and the impurities adsorbed thereto. According to another example embodiment, the cleaning solution for the quartz parts may be provided to the quartz parts including the thin films and the impurities by contacting an impregnated wiper or a sponge with the cleaning solution. According to yet another example embodiment, the quartz parts onto which the thin films and the impurities are adsorbed may be dipped into the cleaning solution for the quartz parts contained in a cleaning bath. The quartz parts may be the constituting parts of, for example, an etching apparatus, a deposition apparatus, a cleaning apparatus, and so on. The thin films and the impurities include the residues of a deposition gas applied during implementing the deposition process. As one example, the residue may include, for example, oxygen-containing impurities, carbon-containing impurities, metal-containing impurities, etc.

Then, the thin films and the impurities remaining on the quartz parts of an apparatus for manufacturing a semiconductor device are removed by performing a cleaning process using the cleaning solution of example embodiments of the present invention (S130).

The cleaning solution for the quartz parts promotes an oxidation reaction and a decomposition reaction using fluorine and the thin films and the impurities adsorbed onto the quartz parts can be rapidly dissolved and removed from the quartz parts. In addition, the cleaning process also may be performed by, for example, providing the cleaning solution to the quartz parts including the thin films and the impurities for about 5 to about 60 minutes. Here, the providing time of the cleaning solution may be dependent on the thickness of the thin films and the impurities adsorbed onto the quartz parts and the temperature of the cleaning solution.

After removing the thin films and the impurities, a rinsing process for rinsing the quartz parts using, for example, water and a drying process for removing water from the quartz parts are implemented. The rinsing process using water is a process for completely removing the constituting components of the cleaning solution remaining on the quartz parts until the amount of the remaining components reaches under an allowed reference value.

According to example embodiments with regard to the method of cleaning using the cleaning solution for the quartz parts, the cleansing solution may rarely react with stainless steel as well as quartz. Therefore, the thin films and the impurities adsorbed onto the stainless steel may also be removed rapidly without damaging the stainless steel material.

Example embodiments will be described in more detail by preparing the cleaning solutions for the quartz parts and then testing the characteristics of the solutions. However, the preparation and test of the cleaning solutions set forth herein are illustrative of examples, and is not to be construed as limiting the present invention. Example embodiments can be changed and modified in various methods. In addition, the changing of the components of the cleaning solution is implemented to evaluate whether or not the quartz is damaged.

Preparation of Cleaning Solutions

Comparative cleaning solutions 1 to 3 in accordance with the conventional method and cleaning solutions 1 to 14 in accordance with example embodiments were prepared utilizing the components illustrated in Table 1.

TABLE 1

| | Components of cleaning solutions | | | | | |
|---|---|---|---|---|---|---|
| Cleaning solution | Ammonium compound (wt %) | Oxidizing agent (wt %) | Fluorine compound (wt %) | Water (wt %) | Additive (wt %) | Quartz weight Change (%) |
| Comparative Example 1 | — | — | 50.0 (HF) | 50.0 | — | 3.23 |
| Comparative Example 2 | — | 17.5 ($HNO_3$) | 37.5 (HF) | 45.0 | — | 2.01 |
| Comparative Example 3 | 5.0 ($NH_4OH$) | 17.5 ($HNO_3$) | 31.3 (HF) | 46.2 | — | 2.09 |
| Example 1 | 5.0 ($NH_4OH$) | 17.5 ($HNO_3$) | 25.0 (HF) | 52.5 | — | 1.02 |
| Example 2 | 5.0 ($NH_4OH$) | 17.5 ($HNO_3$) | 10.0 (HF) | 67.5 | — | 0.28 |
| Example 3 | 5.0 ($NH_4OH$) | 10.3 ($HNO_3$) | 10.0 (HF) | 74.7 | — | 0.42 |
| Example 4 | 5.0 ($NH_4OH$) | 24.5 ($HNO_3$) | 10.0 (HF) | 60.5 | — | 0.58 |
| Example 5 | 17.5 (TMAH) | 17.5 ($HNO_3$) | 10.0 (HF) | 55.0 | — | 0.48 |
| Example 6 | 17.5 ($NH_4Cl$) | 17.5 ($HNO_3$) | 10.0 (HF) | 55.0 | — | 0.63 |
| Example 7 | 17.5 ($NH_4OH$) | 17.5 ($HNO_3$) | 10.0 (HF) | 55.0 | — | 0.25 |
| Example 8 | 17.5 ($NH_4OH$) | 17.5 ($HNO_3$) | 20.0 (HF) | 45.0 | — | 0.19 |
| Example 9 | 17.5 ($NH_4OH$) | 28.0 ($HNO_3$) | 20.0 (HF) | 34.5 | — | 0.28 |
| Example 10 | 17.5 ($NH_4OH$) | 7.0 ($HNO_3$) | 20.0 (HF) | 55.5 | — | 0.198 |
| Example 11 | 35.0 ($NH_4OH$) | 22.0 ($H_2SO_4$) | 30.0 (HF) | 13.0 | — | 0.52 |
| Example 12 | 35.0 ($NH_4OH$) | 22.0 ($H_2SO_4$) + 12.0 ($H_2O_2$) | 30.0 (HF) | 1.0 | — | 0.48 |
| Example 13 | 5.0 ($NH_4OH$) | 17.5 ($HNO_3$) | 10.0 (HF) | 66.0 | 1.5 ($CH_3CO_2H$) | 0.72 |
| Example 14 | 5.0 ($NH_4OH$) | 17.5 ($HNO_3$) | 10.0 (HF) | 66.0 | 1.5 (Oxalic acid) | 0.66 |

Assessment of Cleaning Solutions

To assess the efficiency of the cleaning solutions, the following experiments were carried out. Applied chemicals were highly purified compounds utilized for the manufacture of the semiconductor devices and no additional purifying process was implemented. For evaluating the cleaning solutions, unused quartz pieces having a size of about 2 cm×about 2 cm of A-grade was made for the test of a surface roughness and a weight change. To verify the removing efficiency of the deposited layer, a quartz part on which about 50,000 Å or over of deposited films including polysilicon, silicon nitride, silicon oxide, etc. was utilized. Here, the assessment of the cleaning solution was performed after dipping the quartz piece into each cleaning solution for about 30 minutes. After that, the surface of the quartz piece was observed and analyzed by using a microscope and the weight change of the quartz piece was measured by using a microbalance.

Assessment of Comparative Cleaning Solutions 1 to 3

The comparative cleaning solutions 1 to 3 were poured into three 100 mL teflon beakers, respectively, and the unused three quartz pieces of about 2 cm×about 2 cm of A-grade were dipped into each cleaning solution for about 30 minutes. After that, each quartz piece was rinsed using deionized water for about 30 minutes and was dried using nitrogen gas. The weight change of the quartz piece before and after the cleaning and the surface roughness of the quartz were observed. The results are illustrated in Table 1 and FIGS. 3A and 3B.

Referring to Table 1, the weight change of the quartz piece was about 3.23% when the comparative cleaning solution 1 including only an etching agent was applied and the weight change of the quartz piece was about 2.01% when the conventionally utilized comparative cleaning solution 2 for the cleaning process was applied. The comparative cleaning solution 3 included an excessive amount of fluoride compound and the weight change of the quartz piece was about 2.09%. The weight change of the quartz piece was relatively high when applying the comparative cleaning solutions 1 to 3.

Figure 3A:
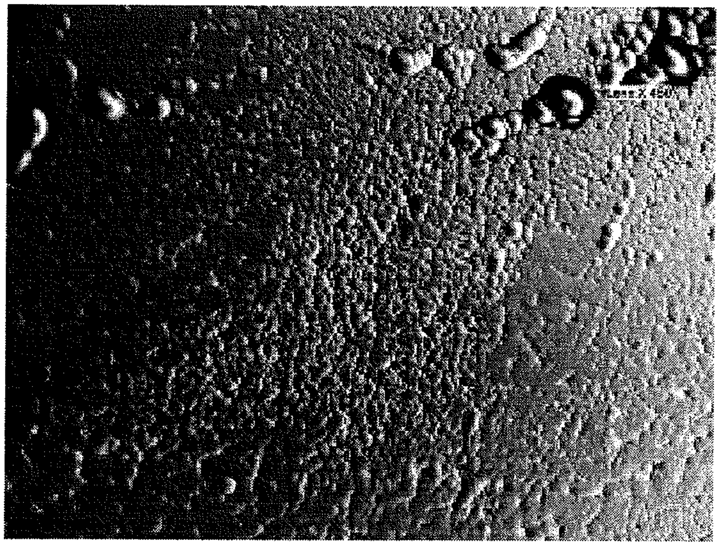
FIG. 3A (RELATED ART)
FIGS. 3A and 3B are photographs for showing the surface portion of a piece of a quartz part after implementing a cleaning process using comparative cleaning solution 2 of the conventional cleaning solution.
Figure 3B:
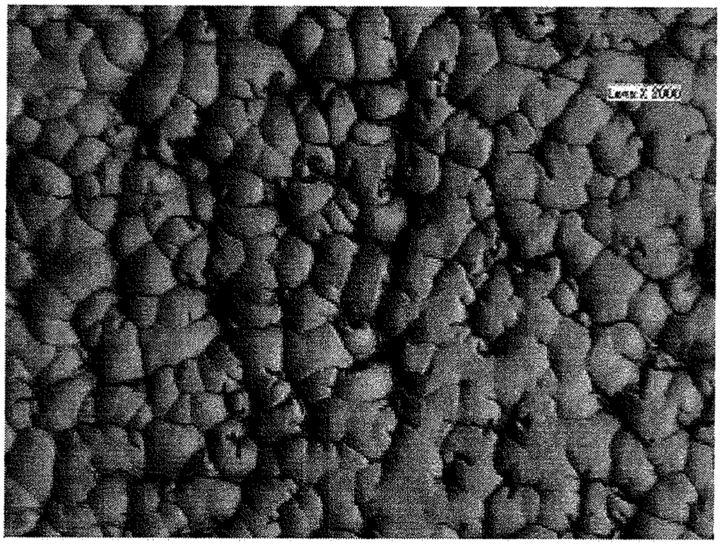
FIG. 3B (RELATED ART)

FIGS. 3A and 3B are photographs for showing the surface portion of a piece of quartz parts after implementing a cleaning process using comparative cleaning solution 2 in accordance with the conventional method. FIG. 3A is a photograph of about 450 times magnification, and FIG. 3B is a photograph of about 2,000 times magnification.

Referring to FIGS. 3A and 3B, it may be noted that the surface portion of the quartz piece is not uniform when the quartz piece is cleaned using the comparative cleaning solution 2.

Assessment of Cleaning Solutions 1 and 2

The weight change of each quartz piece before and after the cleaning was measured for the cleaning solutions 1 and 2, respectively, by applying the same method applied for the comparative cleaning solutions 1 to 3. The results are illustrated in Table 1.

Referring to Table 1, the cleaning solutions 1 and 2 include the same amount of the ammonium compound and nitric acid, the oxidizing agent, while changing the amount of the hydrofluoric acid. It is confirmed that the weight change of the quartz piece decreases when the amount of the hydrofluoric acid decreases. In particular, for the cleaning solution 2 including hydrofluoric acid of about 10.0 wt %, the weight change of the quartz piece is largely reduced and is about 0.28 wt %.

Assessment of Cleaning Solutions 3 and 4

The weight change of each quartz piece before and after the cleaning was measured for the cleaning solutions 3 and 4, respectively, by applying the same method applied for the comparative cleaning solutions 1 to 3. The results are illustrated in Table 1.

Referring to Table 1, the cleaning solutions 3 and 4 include the same amount of the ammonium compound and the hydrofluoric acid, the etching agent, while changing the amount of the nitric acid, the oxidizing agent. Referring to Table 1, the amount of the oxidizing agent, nitric acid, does not have much influence on the weight change of the quartz piece. That is, the oxidizing agent, nitric acid is not a decisive component used for the etching of the quartz part among the components included in the cleaning solution.

Assessment of Cleaning Solutions 5 and 6

The weight change of each quartz piece before and after the cleaning was measured for the cleaning solutions 5 and 6, respectively, by applying the same method utilized for the comparative cleaning solutions 1 to 3. The results are illustrated in Table 1.

Referring to Table 1, the cleaning solutions 5 and 6 include the same amount of the ammonium compound, the oxidizing agent and the hydrofluoric acid, while changing the kind of the ammonium compound. Tetramethyl ammonium fluoride was included in the cleaning solution 5 and ammonium chloride was included in the cleaning solution 6. It is confirmed that the change of the kind of the ammonium compound does not have much influence on the weight change of the quartz piece. That is, the ammonium compound is not a decisive component used for the etching of the quartz part among the components included in the cleaning solution.

Assessment of Cleaning Solutions 7 and 8

The weight change of each quartz piece before and after the cleaning was measured for the cleaning solutions 7 and 8, respectively, by applying the same method utilized for the comparative cleaning solutions 1 to 3. The results are illustrated in Table 1 and FIGS. 4A and 4B.

Referring to Table 1, the cleaning solutions 7 and 8 include about 17.5 wt % of the ammonium compound and the use of the large amount of the ammonium compound does not have a considerable influence on the weight change of the quartz piece.

In particular, it is confirmed that the generation of cracks on the surface of the quartz piece is significantly reduced when the cleaning solution 7 is used when comparing with the result obtained by applying the comparative cleaning solutions.

Figure 4A:
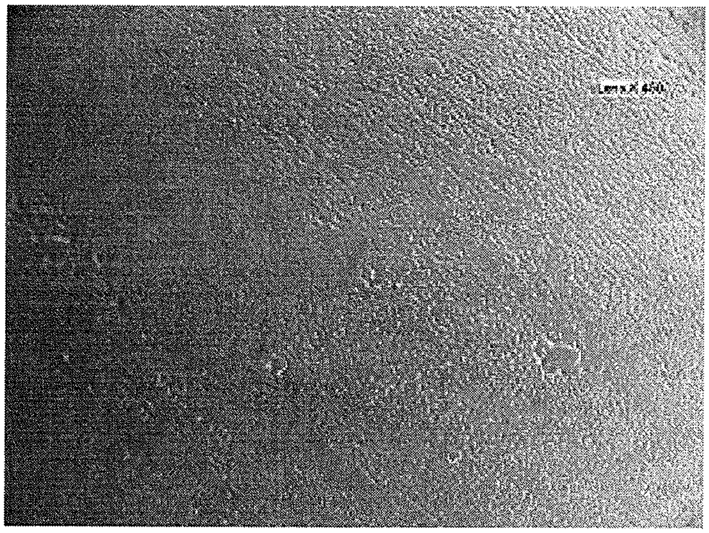
FIGS. 4A and 4B are photographs for showing the surface portion of a piece of a quartz part after implementing a cleaning process using cleaning solution 7 in accordance with an example embodiment.
Figure 4B:
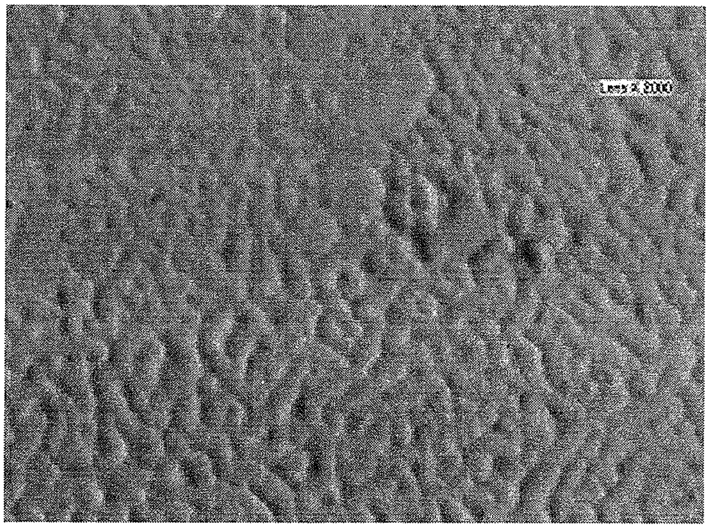

FIGS. 4A and 4B are photographs for showing the surface portion of a piece of a quartz part after implementing a cleaning process using cleaning solution 7 in accordance with example embodiments of the present invention. FIG. 4A is a photograph of about 450 times magnification and FIG. 4B is a photograph of about 2000 times magnification. The ammonium compound does not function as the etching material of the quartz, but is however the constituting factor improving the cleaning efficiency of the thin films and the impurities among the components included in the cleaning solution.

Assessment of Cleaning Solutions 9 and 10

The weight change of each quartz piece before and after the cleaning was measured for the cleaning solutions 9 and 10, respectively, by applying the same method utilized for the comparative cleaning solutions 1 to 3. The results are illustrated in Table 1.

Referring to Table 1, the cleaning solutions 9 and 10 include the same amount of the ammonium compound and the hydrofluoric acid, the etching agent, while changing the amount of the nitric acid, the oxidizing agent when comparing with the cleaning solution 8. The changing of the amount of the oxidizing agent does not have much influence on the weight change of the quartz piece. That is, the oxidizing agent included in the cleaning solution is not the decisive component for the etching of the quartz part.

Assessment of Cleaning Solution 11

The weight change of the quartz piece before and after the cleaning was measured for the cleaning solution 11 by applying the same method utilized for the comparative cleaning solutions 1 to 3. The results are illustrated in Table 1.

Referring to Table 1, the cleaning solution 11 includes the same mol number of sulfuric acid instead of nitric acid as the oxidizing agent while increasing the amounts of the etching agent and the ammonium compound when comparing with the composition of the cleaning solution 2. The weight change of the quartz piece after implementing the cleaning process is increased by about 2 times. That is, it is confirmed that the influence of the etching agent onto the quartz is larger than that of the oxidizing agent.

Assessment of Cleaning Solution 12

The weight change of the quartz piece before and after the cleaning was measured for the cleaning solution 12 by applying the same method utilized for the comparative cleaning solutions 1 to 3. The results are illustrated in Table 1.

Referring to Table 1, the cleaning solution 12 includes almost the same amount of the same components except that additionally including hydrogen peroxide solution as the oxidizing agent when comparing with the cleaning solution 11. It is confirmed that the weight change of the quartz piece after implementing the cleaning process is similar for the two cleaning solutions. That is, the addition of the additional oxidizing agent does not result in the damage of the quartz piece during the cleaning.

Assessment of Cleaning Solutions 13 and 14

The weight change of each quartz piece before and after the cleaning was measured for the cleaning solutions 13 and 14, respectively, by applying the same method utilized for the comparative cleaning solutions 1 to 3. The results are illustrated in Table 1 and FIGS. 5A and 5B.

Referring to Table 1, the cleaning solutions 13 and 14 include the same amount of the same components of the ammonium compound, the oxidizing agent and the fluorine compound except that additional organic acids were included when comparing with the components of the cleaning solution 2. The weight of the quartz parts increase slightly after implementing the cleaning process for the quartz piece for these two cleaning solutions. However, it was confirmed that the cleaning solutions 13 and 14 had a rapid etching rate with respect to a metal layer.

Figure 5A:
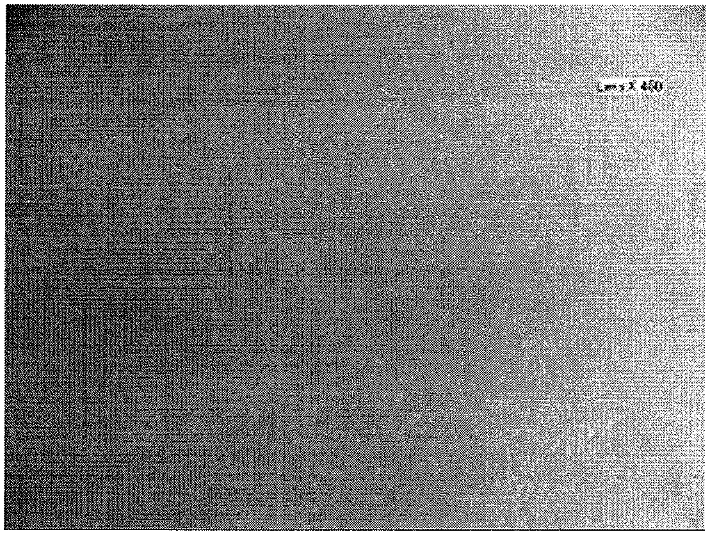
FIGS. 5A and 5B are photographs for showing the surface portion of a piece of a quartz part after implementing a cleaning process using cleaning solution 14 in accordance with an example embodiment.
Figure 5B:
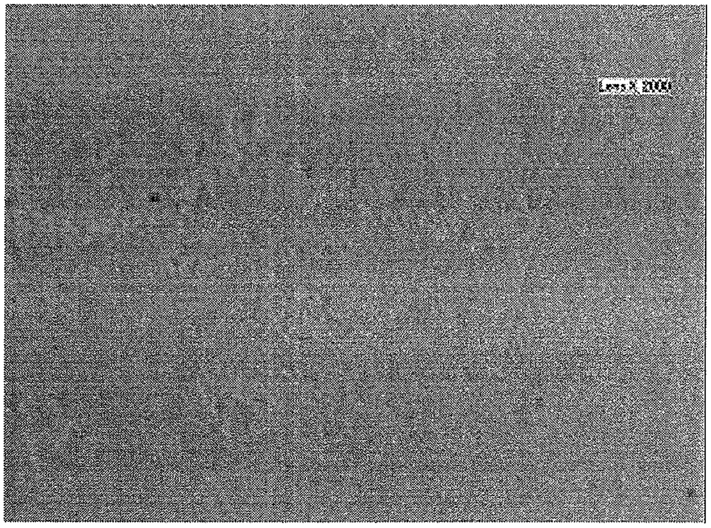

FIGS. 5A and 5B are photographs for showing the surface portion of a piece of a quartz part after implementing a cleaning process using cleaning solution 14 in accordance with example embodiments of the present invention. FIG. 5A is a photograph of about 450 times magnification and FIG. 5B is a photograph of about 2000 times magnification. Referring to FIGS. 5A and 5B, the surface roughness of the quartz piece is largely reduced.

As described above, the cleaning solution for the quartz parts in accordance with the example embodiments of the present invention includes an ammonium compound, an acidic oxidizing agent, a fluorine compound and water. The cleaning solution can effectively remove the residual thin films and impurities from the surface of the quartz parts installed on the apparatus for manufacturing semiconductor devices. In addition, the cleaning solution for the quartz parts can rapidly and effectively remove the residual thin films and impurities from the surface of the quartz parts without inducing any excessive damage on the surface portion thereof.

Having described the exemplary embodiments of the present invention, it is further noted that it is readily apparent to those of reasonable skill in the art various modifications may be made without departing from the spirit and scope of the invention which is defined by the metes and bounds of the appended claims.

What is claimed is:

1. A method for cleaning a quartz part of an apparatus for manufacturing a semiconductor device, comprising:

providing a cleaning solution to a quartz part including a residual thin film and impurities, the cleaning solution comprising from about 5 to about 35 wt % of an ammonium compound, wherein the ammonium compound comprises at least one selected from the group consisting of ammonium hydroxide, methyl ammonium hydroxide, ethyl ammonium hydroxide, ammonium chloride ($NH_4Cl$), ammonium bromide ($NH_4Br$) and ammonium carbonate ($(NH_4)_2CO_3$), from about 7 to about 55 wt % of an acidic oxidizing agent, from about 5 to about 30 wt % of a fluorine compound and a remaining amount of water; and implementing a cleaning process to remove the residual thin film and the impurities from a surface of the quartz part using the cleaning solution.

2. The method of claim 1, wherein the cleaning solution comprises from about 10 to about 20 wt % of the ammonium compound, from about 15 to about 35 wt % of the acidic oxidizing agent, from about 10 to about 20 wt % of the fluorine compound and the remaining amount of water.

3. The method of claim 1, wherein the thin film includes at least one impurity selected from the group consisting of an oxygen-containing impurity, a carbon-containing impurity and a metal-containing impurity.

4. The method of claim 1, wherein the quartz part is a constituting part of one of the following apparatuses of an etching apparatus, a deposition apparatus and a cleaning apparatus.

5. The method of claim 1, further comprising implementing a rinsing process to rinse the quartz part using water and a drying process for removing the water from the quartz part, after removing the residual thin film and the impurities from the surface of the quartz part.

6. A method for cleaning a quartz part comprising the steps of:

providing a cleaning solution to the quartz part including a residual thin film and impurities, the cleaning solution comprising from about 5 to about 35 wt % of an ammonium compound, from about 7 to about 55 wt % of an acidic oxidizing agent, from about 5 to about 30 wt % of a fluorine compound, from about 0.1 to about 2 wt % of an organic acid and a remaining amount of water; and implementing a cleaning process for removing the residual thin film and the impurities from a surface of the quartz part using the cleaning solution.

7. The method of claim 6, wherein the cleaning solution comprises from about 10 to about 20 wt % of the ammonium compound, from about 15 to about 35 wt % of the acidic oxidizing agent, from about 10 to about 20 wt % of the fluorine compound, from about 0.5 to about 1.5 wt % of the organic acid and the remaining amount of water.

8. The method of claim 6, wherein the cleaning solution includes from about 10 to about 1000 ppm of a nonionic surfactant, and the nonionic surfactant is a polymer having at least one of ethylene oxide and propylene oxide.

9. The method of claim 1, wherein the cleaning solution is provided to the quartz part including the thin film and the impurities for about 5 to about 60 minutes.

10. The method of claim 1, wherein the fluorine compound comprises at least one selected from the group consisting of hydrofluoric acid, ammonium fluoride, tetramethyl ammonium fluoride, tetraethyl ammonium fluoride, tetrapropyl ammonium fluoride and tetrabutyl ammonium fluoride.

11. The method of claim 1, wherein the oxidizing agent comprises at least one selected from the group consisting of sulfuric acid, nitric acid, ammonium nitrate, ammonium sulfate, ammonium phosphate and hydrogen peroxide solution.

12. The method of claim 6, wherein the ammonium compound comprises at least one selected from the group consisting of ammonium hydroxide, methyl ammonium hydroxide, ethyl ammonium hydroxide, ammonium chloride ($NH_4Cl$), ammonium bromide ($NH_4Br$) and ammonium carbonate ($(NH_4)_2CO_3$).

13. The method of claim 6, wherein the fluorine compound comprises at least one selected from the group consisting of hydrofluoric acid, ammonium fluoride, tetramethyl ammonium fluoride, tetraethyl ammonium fluoride, tetrapropyl ammonium fluoride and tetrabutyl ammonium fluoride.

14. The method of claim 6, wherein the oxidizing agent comprises at least one selected from the group consisting of sulfuric acid, nitric acid, ammonium nitrate, ammonium sulfate, ammonium phosphate and hydrogen peroxide solution.

15. The method of claim 6, wherein the quartz part includes at least one impurity selected from the group consisting of an oxygen-containing impurity, a carbon-containing impurity and a metal-containing impurity.

16. The method of claim 6, wherein the organic acid comprises at least one selected from the group consisting of acetic acid, oxalic acid, malonic acid, succinic acid and ethylenediaminetetraacetic acid (EDTA).

17. The method of claim 6, wherein the quartz part is a constituting part of one of the following apparatuses of an etching apparatus, a deposition apparatus and a cleaning apparatus.

18. The method of claim 6, further comprising implementing a rinsing process to rinse the quartz part using water and a drying process for removing the water from the quartz part, after removing the residual thin film and the impurities from the surface of the quartz part.

19. The method of claim 6, wherein the cleaning solution is provided to the quartz part including the thin film and the impurities for about 5 to about 60 minutes.

* * * * *